United States Patent
Zhang et al.

(10) Patent No.: US 8,709,881 B2
(45) Date of Patent: Apr. 29, 2014

(54) DIRECT CHEMICAL VAPOR DEPOSITION OF GRAPHENE ON DIELECTRIC SURFACES

(75) Inventors: Yuegang Zhang, Cupertino, CA (US); Ariel Ismach, Austin, TX (US)

(73) Assignee: The Regents of the University of California, Oakland, CA (US)

( * ) Notice: Subject to any disclaimer, the term of this patent is extended or adjusted under 35 U.S.C. 154(b) by 256 days.

(21) Appl. No.: 13/098,929

(22) Filed: May 2, 2011

(65) Prior Publication Data

US 2011/0269299 A1 Nov. 3, 2011

Related U.S. Application Data

(60) Provisional application No. 61/330,082, filed on Apr. 30, 2010.

(51) Int. Cl.
*H01L 21/335* (2006.01)

(52) U.S. Cl.
USPC ............. 438/142; 438/197; 257/44; 257/213; 257/E21.4; 216/78; 977/734

(58) Field of Classification Search
USPC ................ 257/44, 213, E21.4; 438/142, 197; 216/78; 977/734
See application file for complete search history.

(56) References Cited

U.S. PATENT DOCUMENTS

| | | | |
|---|---|---|---|
| 4,713,259 A * | 12/1987 | Gartner et al. | 427/570 |
| 2009/0110627 A1 * | 4/2009 | Choi et al. | 423/447.1 |
| 2012/0168724 A1 * | 7/2012 | Park et al. | 257/29 |

FOREIGN PATENT DOCUMENTS

WO    WO 2009119641 A1 * 10/2009 ............. C01B 31/04

OTHER PUBLICATIONS

Ismach et al. ("Direct Chemical Vapor Deposition of Graphene on Dielectric Surfaces", Nano Lett. 2010, 10, 15542-1548 (published online Apr. 2, 2010)).*
Geim, A. K. et al., "The rise of graphene," Nature Materials, vol. 6 No. 3, May 2007, pp. 183-191.
Berger, C. et al., "Ultrathin Epitaxial Graphite: 2D Electron Gas Properties and a Route toward Graphene-based Nanoelectronics," Journal of Physical Cemistry B, vol. 108 No. 52, Oct. 7, 2004, pp. 19912-19916.
Hass, J. et al., "The growth and morphology of epitaxial multilayer graphene," Journal of Physics-Condensed Matter, vol. 20, Jul. 18, 2008, 27 pages.
Stankovich, S. et al., "Graphene-based composite materials," Nature, vol. 442, Jul. 2006, pp. 282-286.
Novoselov, K. et al., "Electric Field Effect in Atomically Thin Carbon Films," Science, Oct. 22, 2004, vol. 306 No. 5696, pp. 666-669.
Zhang, et al., "Experimental observation of the quantum Hall effect and Berry's phase in graphene," Nature, vol. 438 No. 7065, Nov. 2005, pp. 201-204.
Novoselov, K. et al.,"Room-Temperature Quantum Hall Effect in Graphene," Science, Mar. 9, 2007, vol. 315 No. 5817, pp. 1379-1379.

(Continued)

*Primary Examiner* — Thao Le
*Assistant Examiner* — Matthew Gordon
(74) *Attorney, Agent, or Firm* — Withrow & Terranova, P.L.L.C.

(57) ABSTRACT

A substrate is provided that has a metallic layer on a substrate surface of a substrate. A film made of a two dimensional (2-D) material, such as graphene, is deposited on a metallic surface of the metallic layer. The metallic layer is dewet and/or removed to provide the film on the substrate surface.

28 Claims, 20 Drawing Sheets

(56) References Cited

OTHER PUBLICATIONS

Schedin, F. et al., "Detection of individual gas molecules adsorbed on graphene," Nature Materials, Jul. 29, 2007, vol. 6 No. 9, pp. 652-655.
Li, X. et al., "Chemically Derived, Ultrasmooth Graphene Nanoribbon Semiconductors," Science, Feb. 29, 2008, vol. 319 No. 5867, pp. 1229-1232.
Han, M. Y. et al., "Energy Band-Gap Engineering of Graphene Nanoribbon," Physical Review Letters, May 18, 2007, vol. 98 No. 20.
Emtsev, K. V. et al., "Towards wafer-size graphene layers by atmospheric pressure graphitization of silicon carbide," Nature Materials, Feb. 8, 2009, vol. 8 No. 3, pp. 203-207.
Tung, V. C. et al., "High-throughput solution processing of large-scale graphene," Nature Nanotechnology, Jan. 2009, vol. 4 No. 1, pp. 25-29.
Hernandez, Y. et al., "High-yield production of graphene by liquid-phase exfoliation of graphite," Nature Nanotechnology, Aug. 10, 2008, vol. 3 No. 9, pp. 563-568.
Li, D. et al., "Processable aqueous dispersions of graphene nanosheets," Nature Nanotechnology Jan. 27, 2008, vol. 3 No. 2, pp. 101-105.
Dikin, D. et al., "Preparation and characterization of graphene oxide paper," Nature, Jul. 16, 2007, vol. 448 No. 7152, pp. 457-460.
Starodubov, A. G. et al., "Intercalation of silver atoms under a graphite monolayer on Ni(111)," Physics of Solid State, Jul. 2004, vol. 46 No. 7, pp. 1340-1348.
De Parga, A. L. V. et al., "Periodically rippled graphene: growth and spatially resolved electronic structure," Physical Review Letters, Feb. 8, 2008, vol. 100 No. 5.
Coraux, J. et al., "Growth of graphene on Ir(111)," New Journal of Physics, Mar. 13, 2009, vol. 11, 25 pages.
Coraux, J. et al., "Structural coherency of graphene on IR(111)," Nano Letters, Jan. 12, 2008, vol. 8 No. 2, pp. 565-570.
Reina, A. et al., "Large Area, Few-Layer Graphene Films on Arbitrary Substrates by Chemical Vapor Deposition," Nano Letters, Dec. 1, 2008, vol. 9 No. 1, pp. 30-35.
Kim, K. S. et al., "Large-scale pattern growth of graphene films for stretchable transparent electrodes," Nature, Feb. 5, 2009, vol. 457 No. 7230, pp. 706-710.
Bae, S. et al., "30-inch roll-based production of high-quality graphene films for flexible transparent electrodes," arXiv:0912.5485v1, Mar. 16, 2010, 12 pages.
Li, X. et al., "Large-Area Synthesis of High-Quality and Uniform Graphene Films on Copper Foils," Science, May 7, 2009, vol. 324 No. 5932, 12 pages.
Levendorf, M. et al., "Transfer-Free Batch Fabrication of Single Layer Graphene Transistors," Nano Letters, vol. 9, No. 12, Oct. 27, 2009, pp. 4479-4483.
Hofrichter, J. et al., "Synthesis of graphene on silicon dioxide by a solid carbon source," Nano Letters, vol. 10 No. 1, Dec. 22, 2009, pp. 36-42.
Pimenta, M. A. et al., "Studying disorder in graphite-based systems by Raman spectroscopy," Physical Chemistry Chemical Physics, Jan. 11, 2007, vol. 9, pp. 1276-1291.
Ferrari, A. C., "Raman spectroscopy of graphene and graphite: Disorder, electron-phonon coupling, doping and nonadiabatic effects," Solid State Communications, Apr. 27, 2007, vol. 143 No. 1-2, pp. 47-57.
Ferrari, A. C. et al., "Raman spectrum of graphene and graphene layers," Physical Review Letters, Nov. 3, 2006, vol. 97, No. 18, 4 pages.
Malard, L. M. et al., "Raman spectroscopy in graphene," Physics Reports—Review Section of Physics Letters, Mar. 2009, vol. 473 No. 5-6, pp. 51-87.
Poncharal, P. et al., "Raman spectra of misoriented bilayer graphene," Physical Review B, Sep. 17, 2008, vol. 78 No. 11.
Faugeras, C. et al., "Few-layer graphene on SiC, pyrolitic graphite, and graphene: A Raman scattering study," Applied Phys. Letters, Jan. 7, 2008, vol. 92 No. 1, 3 pages.
Hass, J. et al., "Why Multilayer Graphene on 4H-SiC(0001• ) Behaves Like a Single Sheet of Graphene," Physical Review Letters, Mar. 2008, vol. 100 No. 12, 4 pages.
Lee, D. S. et al., "Raman Spectra of Epitaxial Graphene on SiC and of Epitaxial Graphene Transferred to SiO2," Nano Letters, Nov. 2008, vol. 8 No. 12, pp. 4320-4325.
Cancado, L. G. et al., "Measuring the degree of stacking ordering in graphite by Raman spectroscopy," Carbon, Jun. 13, 2008, vol. 46 No. 2, pp. 272-275.
Dresselhaus, M. et al., "Perspectives on Carbon Nanotubes and Graphene Raman Spectroscopy," Nano Letters, vol. 10, No. 3, Jan. 2010, pp. 751-758, DOI: 10.1021/NL904286r.
Ferrari, A. C. et al., "Interpretation of Raman spectra of disordered and amorphous carbon," Journal of Physical Review B, May 15, 2000, vol. 61 No. 20, pp. 14095-14107.
Tuinstra, F. et al., "Characterization of Graphite Fiber Surfaces with Raman Spectroscopy," Journal of Composite Materials, May 23, 1970, vol. 4, pp. 492-499.
Tuinstra, F. et al., "Raman Spectrum of Graphite," Journal of Chem. Phys., Aug. 1, 1970, vol. 53 No. 3, pp. 1126.
Matthews, M. J. et al., "Origin of dispersive effects of the Raman D band in carbon materials," Physical Review B, Mar. 1, 1999, vol. 59 No. 10, pp. R6585-R6588.
Casiraghi, C. et al., "Raman Spectroscopy of Graphene Edges," Nano Letters, Mar. 2009, vol. 9 No. 4, pp. 1433-1441.
Mohiuddin, T.M.G. et al., "Uniaxial strain in graphene by Raman spectroscopy: G peak splitting, Grüneisen parameters, and sample orientation," Physical Review B, May 2009, vol. 79 No. 20, 8 pages.
Casiraghi, C. et al., "Raman fingerprint of charged impurities in graphene," Appl. Phys. Lett., Dec. 2007, vol. 91 No. 23, 3 pages.
Basko, D.M. et al., "Electron-electron interactions and doping dependence of the two-phonon Raman intensity in graphene," Physical Review B, Oct. 2009, vol. 80 No. 16, 10 pages.
Das, A. et al., "Monitoring dopants by Raman scattering in an electrochemically top-gated graphene transistor," Nature Nanotechnology, Mar. 2008, vol. 3 No. 4, pp. 210-215.
Guinea, F. et al., "Midgap states and charge inhomogeneities in corrugated graphene," Physical Review B, Feb. 2008, vol. 77 No. 7, 8 pages.
Cortijo, A. et al., "Minimal conductivity of rippled graphene with topological disorder," Physical Review B, May 2009, vol. 79 No. 18, 9 pages.
Ke Xu, P. C. et al., "Scanning Tunneling Microscopy Characterization of the Electrical Properties of Wrinkles in Exfoliated Graphene Monolayers," Nano Letters, Oct. 2009, vol. 9 No. 12, pp. 4446-4451.
Boukhvalov, D.W. et al., "Enhancement of Chemical Activity in Corrugated Graphene," Journal of Physical Chemistry C, Jul. 31, 2009, vol. 113 No. 32, pp. 14176-14178.
Elias, D.C. et al., "Control of Graphene's Properties by Reversible Hydrogenation: Evidence for Graphane," Science, Jan. 30, 2009, vol. 323 No. 5914, pp. 610-613.
Park, C.H. et al., "Anisotropic behaviours of massless Dirac fermions in graphene under periodic potentials," Nature Physics, Mar. 3, 2008, vol. 4 No. 3, pp. 213-217.

\* cited by examiner

DIRECT CHEMICAL VAPOR DEPOSITION OF GRAPHENE ON DIELECTRIC SURFACES

RELATED APPLICATIONS

This application claims the benefit of provisional patent application Ser. No. 61/330,082, filed Apr. 30, 2010, the disclosure of which is hereby incorporated herein by reference in its entirety.

STATEMENT OF GOVERNMENT SUPPORT

This invention was made with government funds under contract number HR0011-07-3-0002 awarded by DARPA. This work was supported by the Office of Science, Office of Basic Energy Sciences, of the U.S. Department of Energy under contract no. DE-AC02-05CH11231. The U.S. Government has rights in this invention.

FIELD OF THE DISCLOSURE

The disclosure relates to substrates provided with two-dimensional (2-D) materials, such as graphene, and methods of manufacturing the same.

BACKGROUND

Graphene is a two-dimensional (2-D) material that has been attracting extensive scientific interest. The existence of single-layer graphene was not considered possible until recently when graphene was made from highly ordered pyrolytic graphite (HOPG) through mechanical cleavage. Since then, the extraordinary electronic properties of graphene, such as ballistic transport over ~0.4 µm length, high electron mobility, quantum-hall effect at room temperature, and single-molecule field-effect sensitivity, have been experimentally observed. Semiconducting graphene nanoribbons have also been fabricated to demonstrate the high performance of graphene field-effect transistors. However, to make electronic devices from graphene, graphene needs to be placed on a substrate. Unfortunately, prior art methods of creating graphene do not provide an efficient and effective way of providing graphene on a substrate surface.

As mentioned above, one prior art method of creating graphene is through mechanical cleavage, also referred to as mechanical exfoliation. To provide graphene through mechanical exfoliation, graphene is peeled-off or rubbed off bulk graphite and transferred onto oxide substrates. This prior art method produces a very low yield of graphene and has no way of controlling the number of layers in the graphene. Other prior art synthetic methods may create the graphene through sublimation or liquid solution phase exfoliation and then deposit the film onto a substrate surface. However, sublimation requires temperatures in excess of 1300° C. and liquid solution phase exfoliation produces graphene with poor electrical properties due to the chemical processes required to form the graphene. These prior art synthetic methods also produce graphene with small domain sizes and it is difficult to control the number of layers in the graphene. Furthermore, the graphene still has to be transferred onto the target substrate.

Another growth method that has shown some promise is a chemical vapor deposition (CVD) method in which a solid metal, such as Nickel (Ni) or Copper (Cu), is placed in contact with a carbon source. As the metal cools, graphene is precipitated out of or grows on the metal. This prior art method provides larger areas of graphene and allows for good control of the number of layers of graphene. However, as with all of the other synthesis methods, transferring the graphene onto the substrate is an expensive, complicated and dirty process.

SUMMARY

This disclosure relates to substrates provided with two-dimensional (2-D) materials on a substrate surface and methods of providing the 2-D materials on the substrate surfaces. While the embodiments specifically described in the Figures of this disclosure provide graphene on the substrate surface of the substrate, the methods may also be utilized to provide other 2-D materials, such as boron-nitride, on the substrate surface of the substrate. To produce the 2-D material on the substrate surface, a metallic layer may be formed on the substrate surface of the substrate and a film made entirely or partially of the 2-D material is deposited on the metallic surface. In one embodiment, the film is deposited on the metallic surface through a chemical vapor deposition (CVD) process. To provide the film on the substrate surface, the metallic layer may be dewet and/or evaporated. The displacement caused by the decreased spread of the metallic layer when the metallic layer becomes dewet provides the film of the 2-D material on the substrate surface of the substrate. Similarly, the evaporation of the metallic layer may remove the metallic layer so that the film of the 2-D material is placed on the substrate surface. In this manner, larger and higher quality areas of the 2-D materials like graphene can be deposited on the substrate surface of the substrate.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 10:
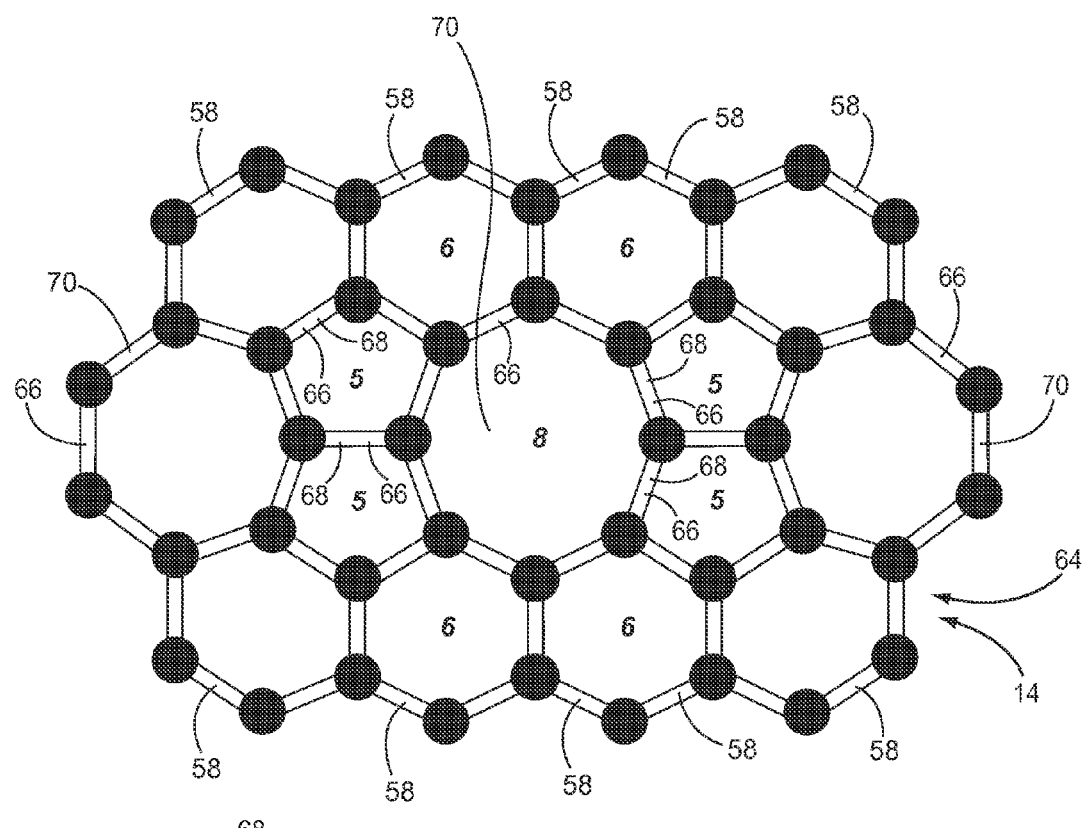

FIG. 10 a molecular representation of yet another embodiment of non-ideal single-layer graphene.

Figure 11:
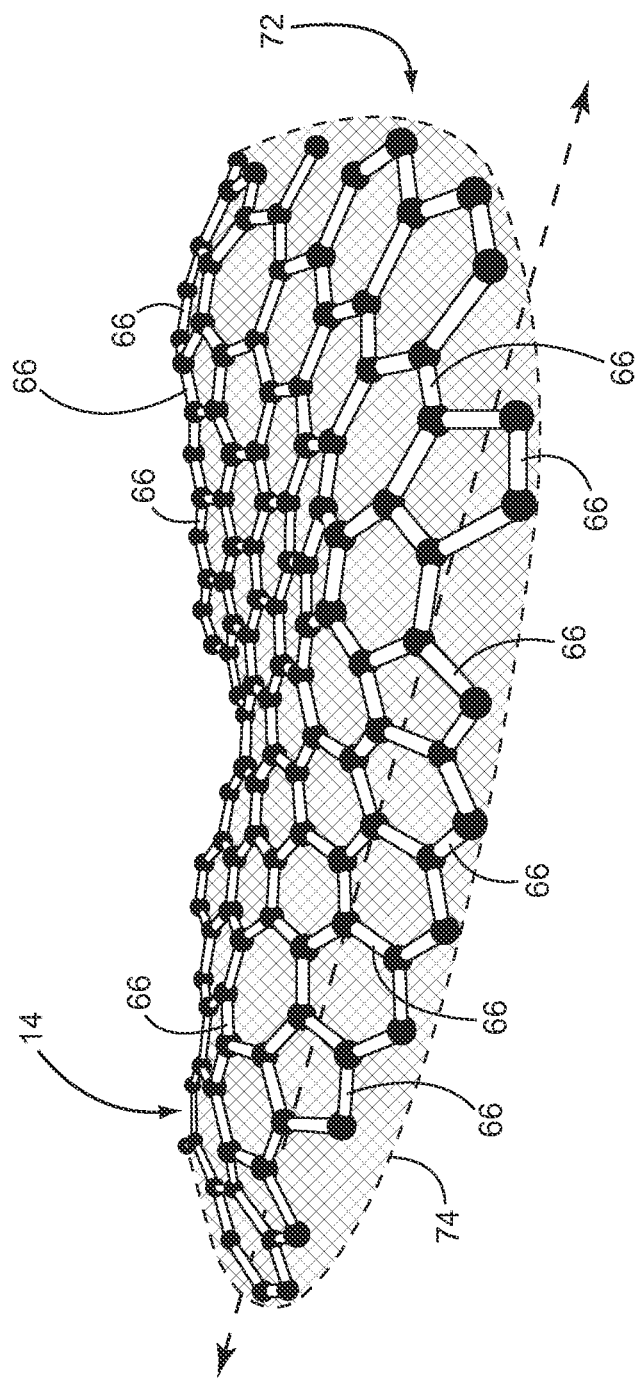

FIG. 11 is a molecular representation of still yet another embodiment of non-ideal single-layer graphene.

Figure 12:
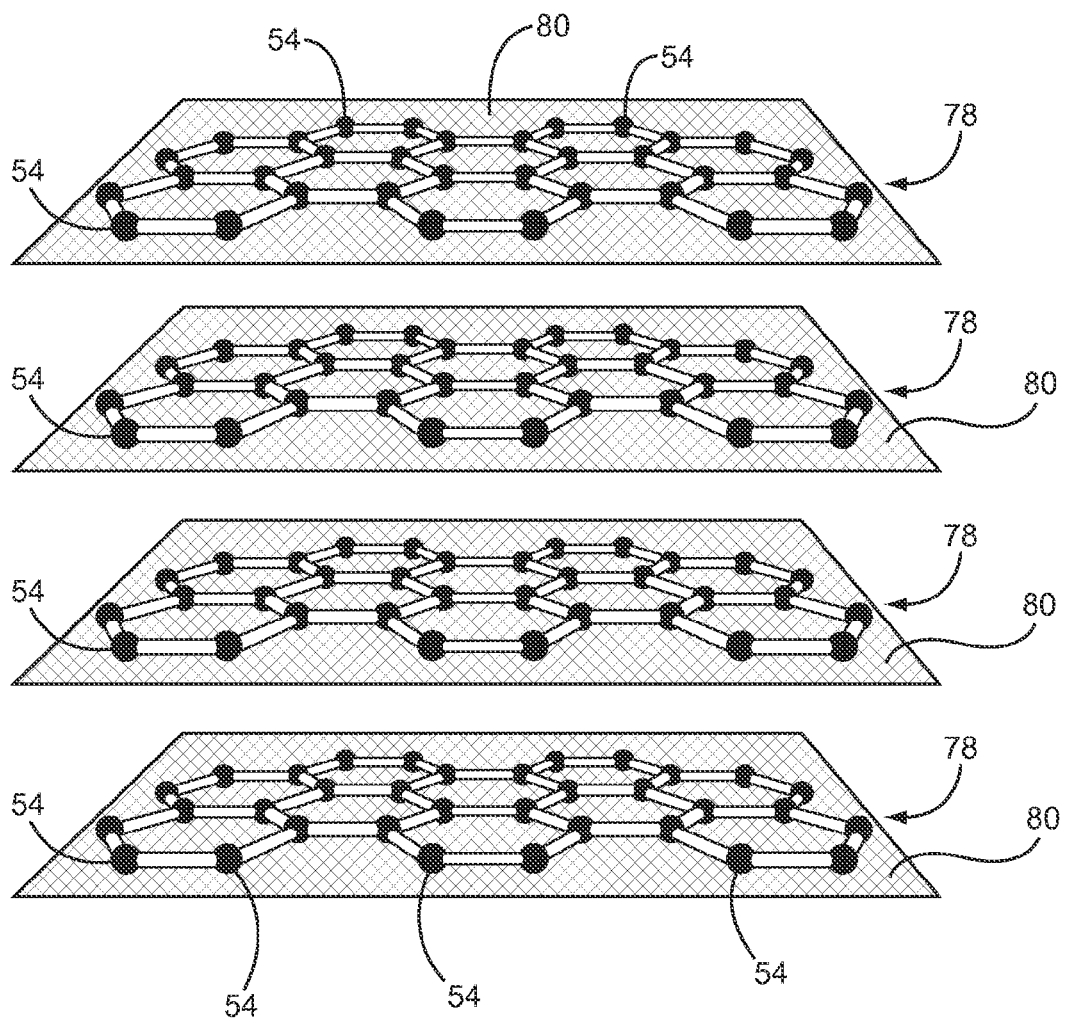

FIG. 12 is a molecular representation of one embodiment of ideal few-layer graphene.

Figure 13:
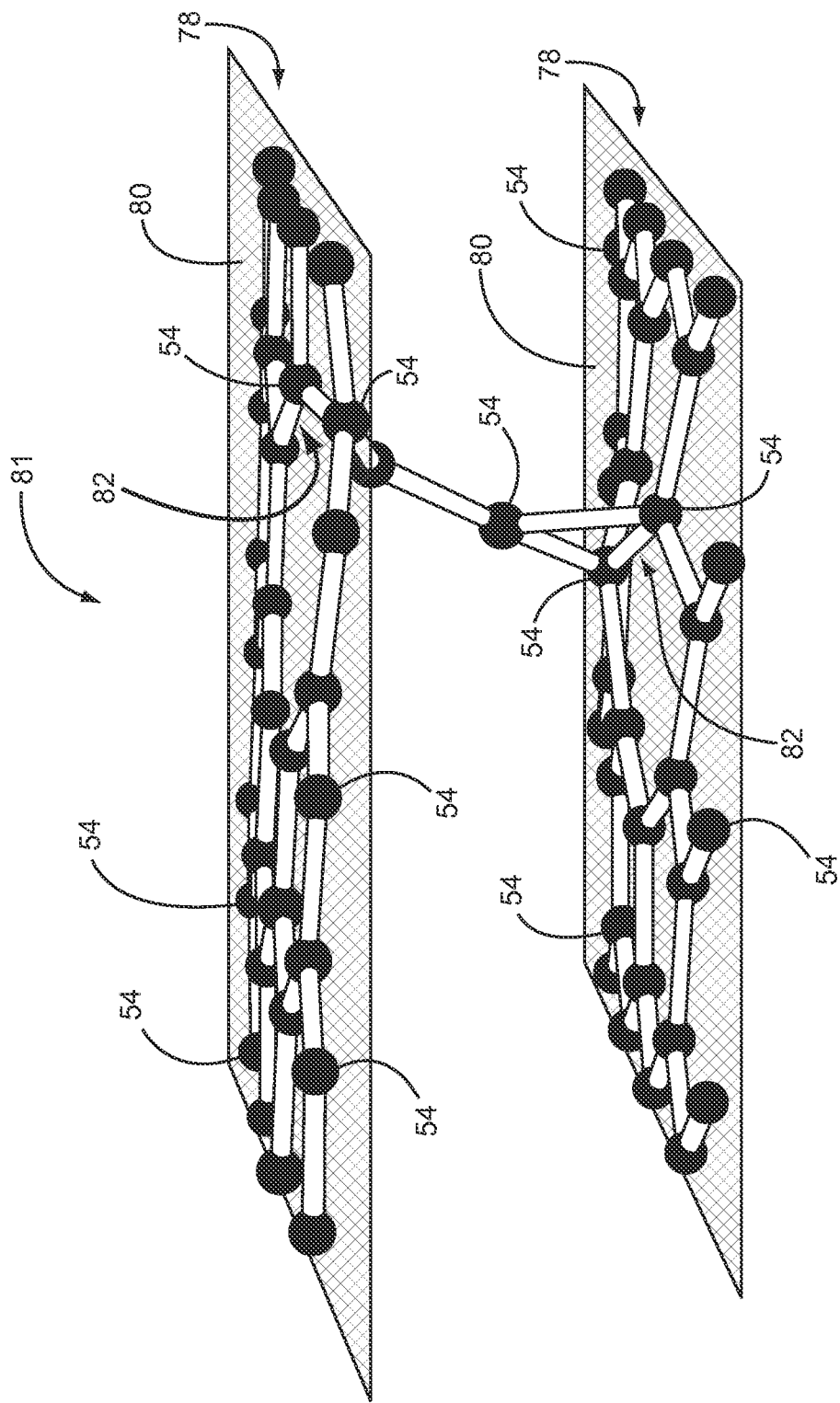

FIG. 13 is a molecular representation of one embodiment of non-ideal few-layer graphene.

Figure 14:
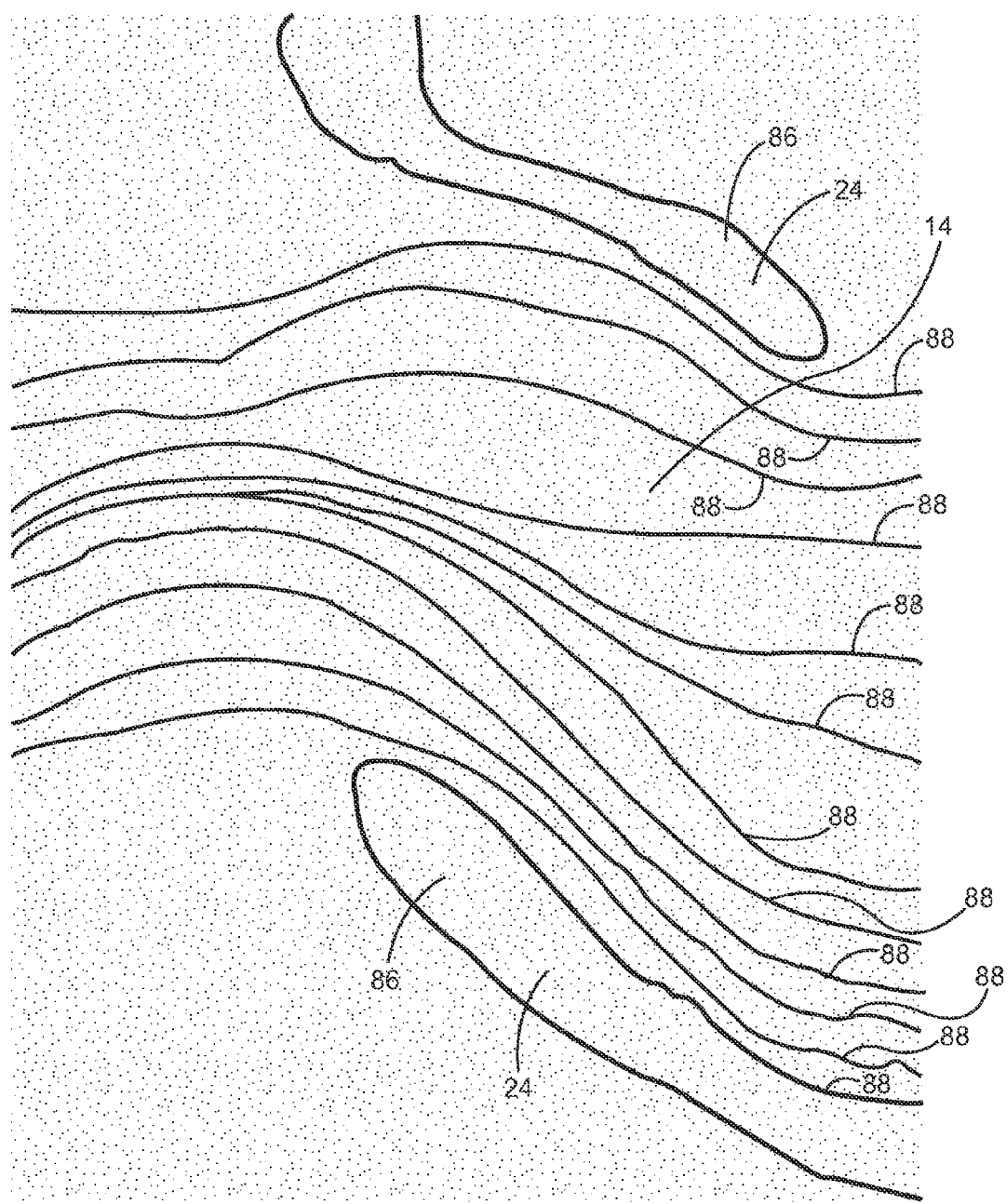

FIG. 14 is a top view of one embodiment of the film having a semi-periodic wrinkled structure.

Figure 15:
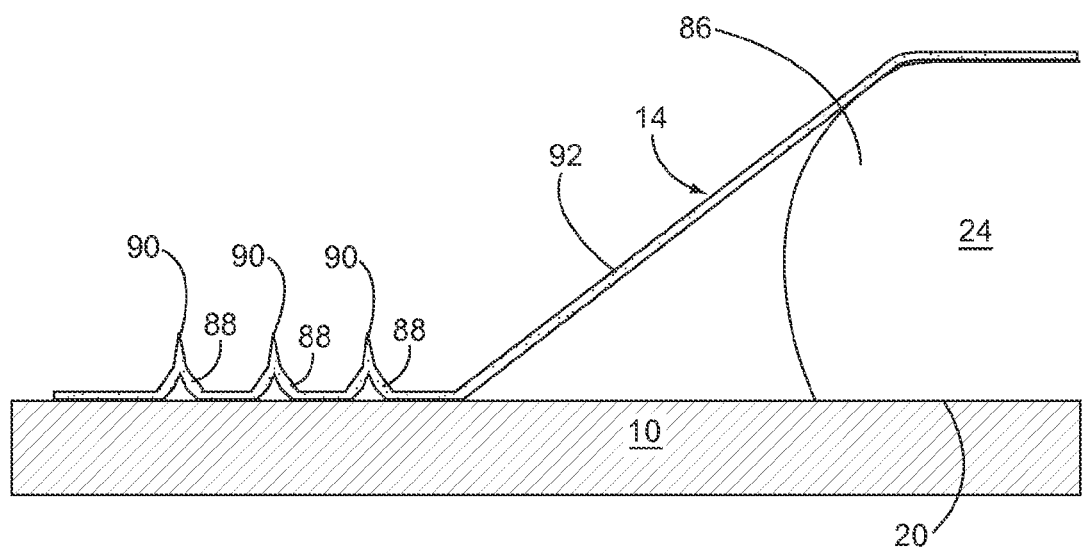

FIG. 15 is a cross sectional view of the film shown in FIG. 14 near the metallic fingers.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
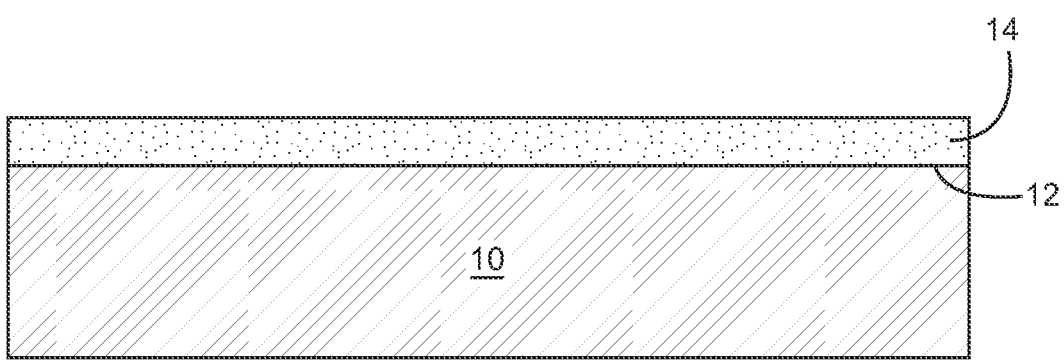
FIG. 1 illustrates one embodiment of a substrate having a film made of a 2-D material formed on a substrate surface.

FIG. 1 illustrates one embodiment of a substrate 10 having a substrate surface 12 and a film 14 provided on a substrate surface 12. The substrate 10 in FIG. 1 is a wafer made from one or more dielectric materials, such as quartz, sapphire, fused silica, or a type of silicon oxide (SiOx) such as silicon dioxide (SiO$_2$). Thus, the substrate surface 12 is a surface of a wafer. The films 14 is made of a 2-D material, which in this example is graphene, and thus the film 14 of FIG. 1 is a carbon-based film. However, the film 14 may be made of any type of 2-D material so long as the 2-D material can be formed using catalytic surface reactions, as explained in further detail below. One example of an alternative 2-D material for the film 14 is boron-nitride.

The film 14 may be made partially or entirely of the 2-D material. For example, imperfections and non-ideal conditions during the deposition process may cause some sections of the film 14 to be formed of the 2-D material while other sections may not be of the 2-D material. As shall be explained in further detail below, the film 14 in FIG. 1 may have imperfections in which sections are made of graphite instead of graphene. On the other hand, the methods described herein can also form the film 14 entirely out of graphene. For instance, film 14 made entirely of graphene having sizes of around 20 μm$^2$-35 μm$^2$ can be easily achieved by the methods described in this disclosure. The graphene may be single-layer graphene and/or few-layer graphene.

One exemplary electronic device that can be built from the substrate 10 is a transistor. To make the transistor, the film 14 may be subsequently patterned through methods of lithography and selectively doped. Additional insulating layers and metal layers may be placed over the film 14 to create transistor terminals for the transistor. Other types of electronic devices, such as sensors, radio frequency (RF) circuits, power electronics applications, and the like may be formed from the substrate 10.

Figure 2:
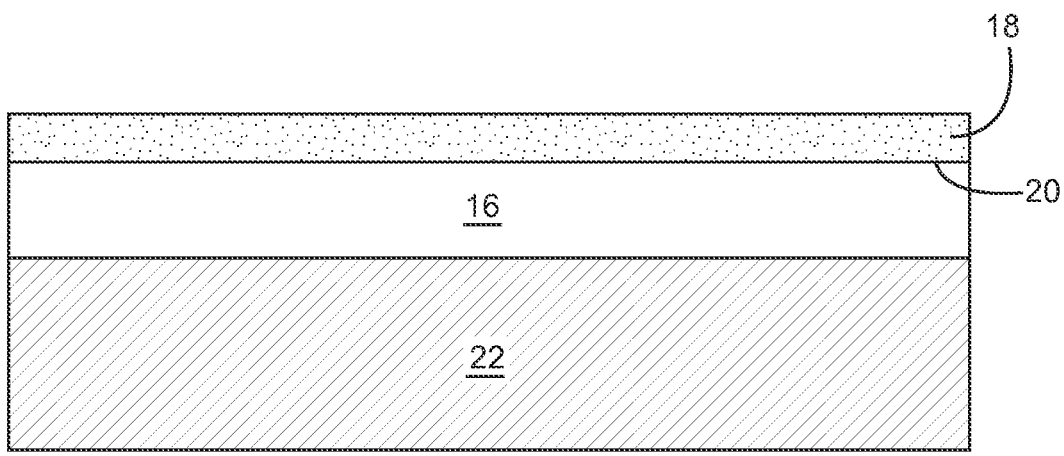
FIG. 2 illustrates another embodiment of a substrate having a film made of a 2-D material formed on a substrate surface.

FIG. 2 is another embodiment of a substrate 16 having a film 18 of 2-D material provided on a substrate surface 20. In this example, the substrate 16 is an insulating layer formed on or placed on the wafer 22. The wafer 22 is made from a semiconductor material(s), such as silicon (Si), gallium arsenide (GaAs), gallium nitride (GaN), silicon carbide (SiC), germanium (Ge), and the like. In turn, the substrate 16 is an insulating layer formed from a dielectric material such as a type of silicon oxide (SiOx), including silicon dioxide (SiO$_2$), and the like. Thus, the substrate surface 20 is a surface of the insulating layer. Accordingly, the film 18 may be used in association with various types of known semiconductor technology, such as silicon-on-insulator (SOI) technology, and the like. The 2-D material in the film 18 shown in FIG. 2 is graphene but alternatively, as explained above, other types of 2-D materials may be utilized for the film 18.

Referring now to FIGS. 3A-3F, FIGS. 3A-3F are utilized to illustrate and describe procedures associated with one embodiment of a method for manufacturing the film 14 on the substrate surface 12 of the substrate 10 shown in FIG. 1. Note that FIGS. 3A-3F are simply illustrative and additional procedures, ancillary procedures, and/or different procedures may be used in alternative embodiments of the methods to create different embodiments of the film 14 on different embodiments of the substrate 10. In one alternative embodiment, procedures similar to those described in FIGS. 3A-3F may be implemented to provide the film 18, shown in FIG. 2, on the substrate surface 20 of the substrate 16.

Figure 3A:
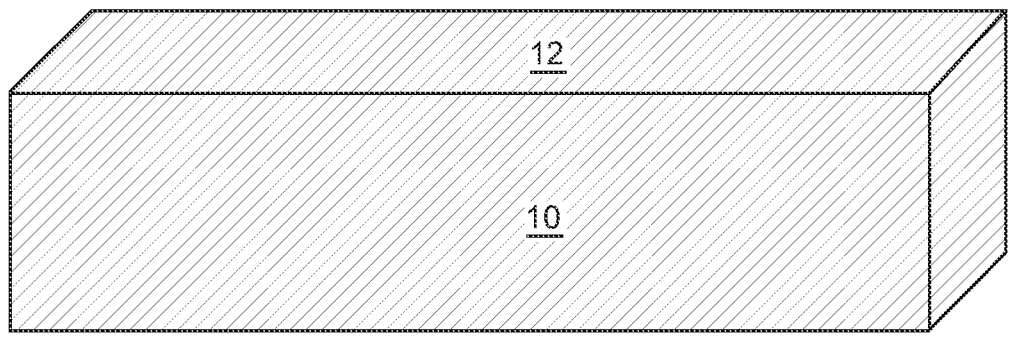
FIGS. 3A-3F are illustrations utilized to describe different procedures involved in one embodiment of a method of manufacturing the film shown in FIG. 1 on the substrate surface.
Figure 3B:
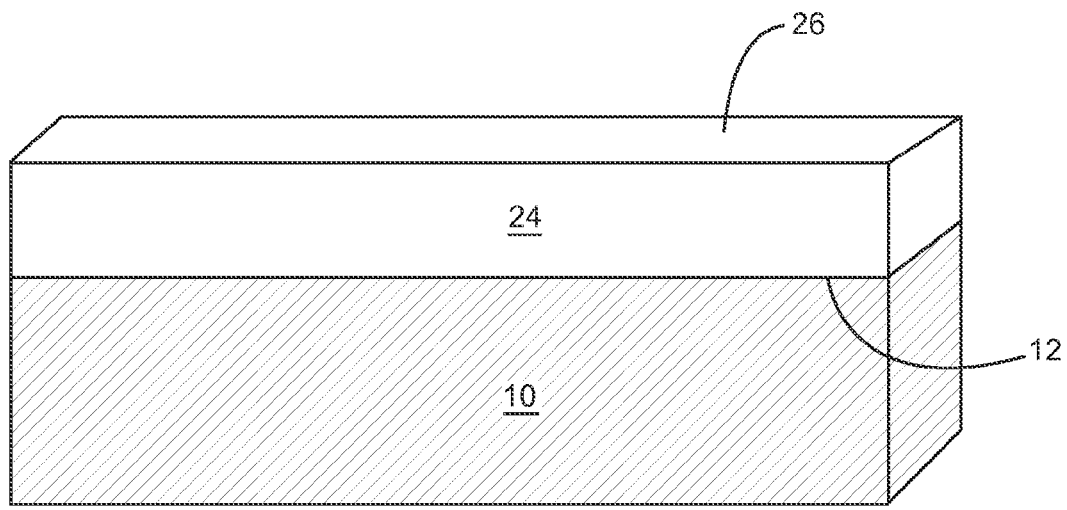

FIG. 3A illustrates the substrate 10 prior to formation of the 2-D material and, in this case, with the uncovered substrate surface 12. Next, a metallic layer 24 may be formed on the substrate surface 12 (FIG. 3B). The metallic layer 24 has a metallic surface 26, which is utilized to form the desired 2-D material. In this example, the metallic layer 24 is made from copper (Cu) and the desired 2-D material to be formed on the metallic layer 24 is graphene. One of the advantages of using copper to form graphene is the low solubility of carbon in copper, which helps control the number of layers of graphene formed in the film 14 (shown in FIG. 1). However, the metallic layer 24 may be formed from any suitable metallic material(s) so long as the metallic surface 26 made from the metallic material is capable of providing catalytic surface reactions that form the desired 2-D material. For example, other possible metallic materials besides copper may be metals such as nickel (Ni), gold (Au), silver (Ag), cobalt (Co), platinum (Pt), rubidium (Ru), iridium (Ir), and the like. In addition, the metallic layer 24 may be made from metal alloys, layered metallic materials, or metals mixed with or forming ionic or covalent bonds with non-metallic materials to provide a metallic material with the desired material properties.

Also, the metallic layer 24 may be formed by any known process on the substrate surface 12. For example, the metallic layer 24 may be formed using sputtering, CVD, physical vapor deposition (PVD), and the like. One type of PVD process that may be used to create the metallic layer 24 is an Electron Beam Physical Vapor Deposition process (EBPVD). During EBPVD, the substrate 10 (as shown in FIG. 3A) may be placed in a vacuum chamber that is evacuated below atmospheric pressure. A high energy electron beam may be applied to an ingot made from the desired metallic material for the metallic layer 24. The electron beam vaporizes the metallic material to form a metallic vapor. The substrate surface 12 may be exposed to the metallic vapor, which cools and forms the metallic layer 24 on the substrate surface 12 (as shown in FIG. 3B). When the substrate 10 is provided and the metallic layer 24 is formed on the substrate surface 12, the thickness of the metallic layer 24 may vary in accordance with the type of metallic materials required for the deposition process in addition to the desired characteristics of the 2-D material to be formed on the metallic layer 24. As mentioned above, the metallic layer 24 in this example is made of copper and may have a thickness between 10 nanometers to 1 micrometer (μm) and preferably has a thickness of between around 100 nanometers (nm) to 500 nm. Additional steps such as cleaning the metallic surface 26 and patterning the metallic surface 26 may be performed after forming the metallic layer 24 on the substrate surface 12, if desired.

Note that while FIGS. 3A and 3B describe this specific embodiment of the method as including the creation of the metallic layer 24 on the substrate surface 12 to provide a substrate 10 having a metallic layer 24 on the substrate surface 12, in alternative embodiments, the substrate 10 may be provided with the metallic layer 24 already formed on the substrate surface 12 without requiring additional in-house processes to form the metallic layer 24. Consequently, some or all of the processes described above in FIGS. 3A and 3B for creating the metallic layer 24 may not be required in these alternative embodiments. For example, the substrate 10 may be purchased from another manufacturer, supplier, or laboratory with the metallic layer 24 already formed on the substrate surface 12. In still other embodiments of the methods, the metallic layer 24 may be created on the substrate surface 12 during other extraneous or supplementary processes such as a wafer fabrication process and the like.

Figure 3C:
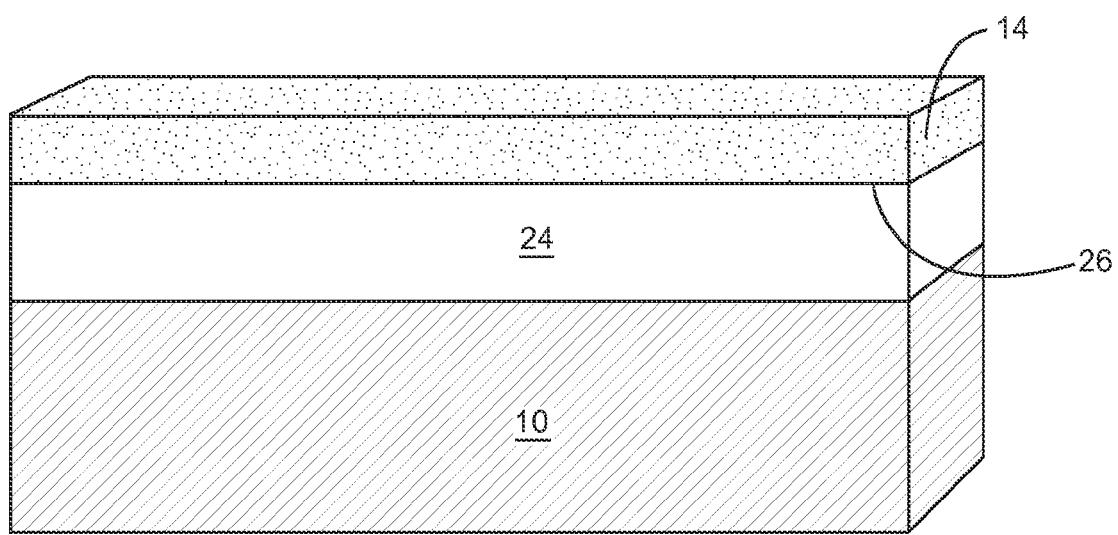

Next, the metallic layer 24 has a metallic surface 26 that serves as a metallic catalyst during a CVD process. One embodiment of the CVD process is described by FIGS. 3C-3F. During the CVD process, the metallic surface 26 is exposed to a precursor(s), which may be in the form of a gas, so that the precursor diffuses and is applied on the metallic surface 26. The vacuum chamber may also heat the substrate 10 so that the metallic layer 24 becomes semi-molten or molten. Upon the precursor being applied on the metallic surface 26, the precursor experiences catalytic decomposition to form the film 14 of the 2-D material on the metallic surface 26 (FIG. 3C). The precursor is selected so that the catalytic decomposition of the precursor forms the desired 2-D material of the film 14. In this manner, the film 14 is deposited on the metallic surface 26. The CVD process in this example deposits a carbon-based film 14 on the metallic surface 26 that is made entirely or partially of graphene. The graphene in the film 14 may be single-layer graphene and/or few-layer graphene, depending on the selected reactions conditions selected within the vacuum chamber. To form the carbon-based film 14 in this example, the precursor may be a hydrocarbon(s) such as, methane ($CH_4$), ethylene ($C_2H_4$), and the like. The precursor may also include and be mixed with other gases such as hydrogen ($H_2$). For a 1" CVD system, the hydrocarbon may be provided at a flow rate of between 5 standard cubic centimeters per minute (sccm) to 100 sccm and the hydrogen may flow at a rate of between 0 sccm to 100 sccm so that the precursor is provided with the desired gas concentrations. For other larger CVD systems, they can vary between 0 sccm to 2000 sccm.

The CVD process may be implemented at atmospheric pressure or the vacuum chamber may be evacuated so that the metallic layer 24 is pressurized below atmospheric pressure. In this example, the metallic layer 24 is made of copper and the metallic surface 26 is pressurized from between 10 mTorrs to atmospheric pressure. Preferably, the vacuum chamber is evacuated so that the metallic surface 26 is pressurized to between 100 mTorr to 500 mTorr during the CVD process. Since the metallic layer 24 in this example is made of copper and copper has a melting temperature of around 1084° C. at pressures between 100 mTorr to 500 mTorr, the vacuum chamber may heat the substrate 10 and thereby the metallic layer 24 to around 900° C.-1000° C. so that the metallic surface 26 can serve as a metal catalyst.

Figure 3D:
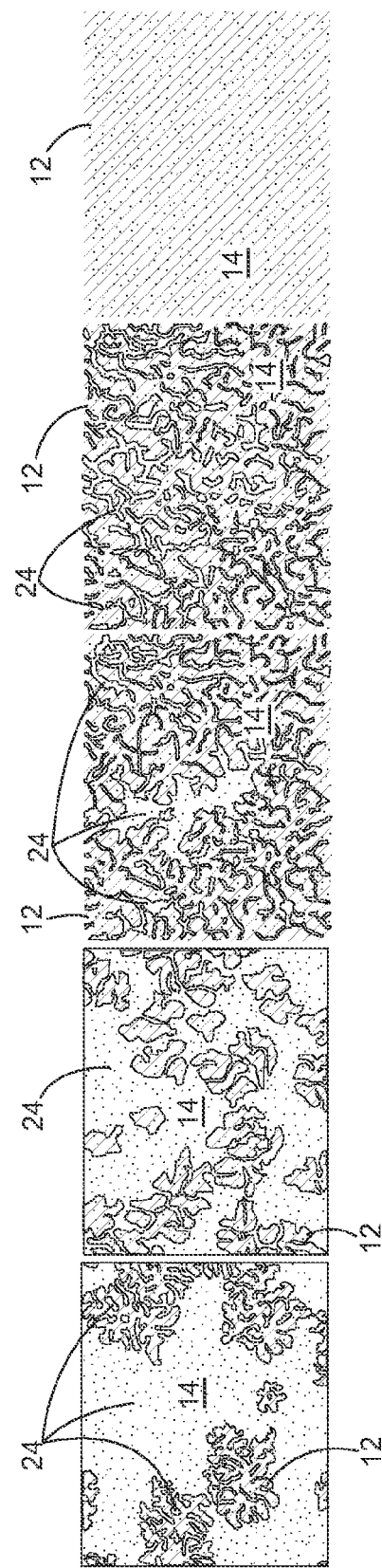
Figure 3E:
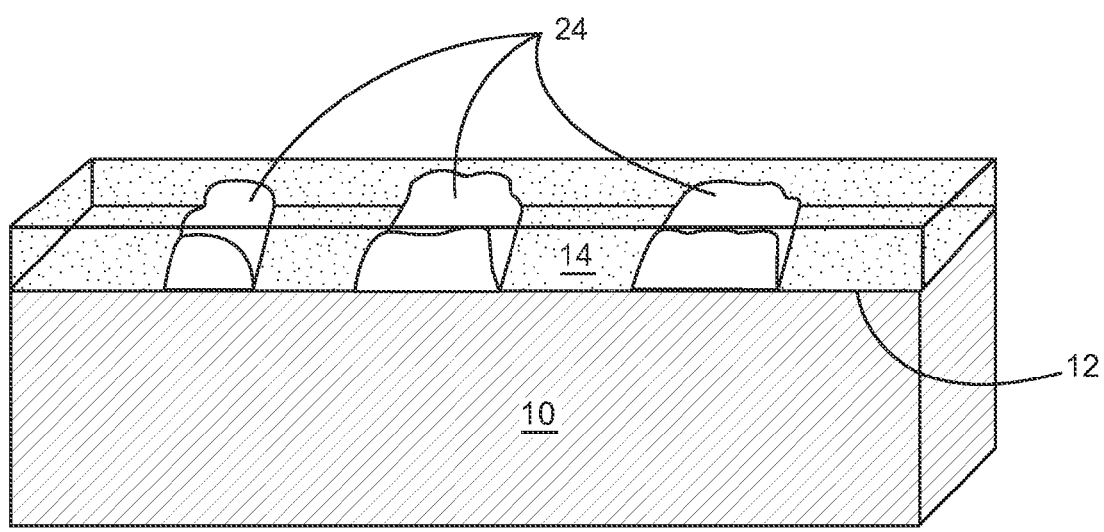

Next, before, during, or after, the film 14 is deposited on the metallic surface 26, the metallic layer 24 is dewet (FIG. 3D and FIG. 3E). The heating of the metallic layer 24 can cause the metallic layer 24 to become molten or at least become partially molten and decreases the spreading coefficient of liquefied metallic layer 24. The spreading coefficient of the metallic layer 24 continues to decrease until the metallic layer 24 is dewet and breaks into metallic puddles, metallic fingers, and/or metallic droplets. Consequently, the heating of the metallic layer 24 may cause the dewetting of the metallic layer 24. FIG. 3D is a temporal illustration of the evolution of the dewetting of the metallic layer 24 after 15, 30, 60, 120 and approximately 420 minutes of the CVD process. As time passes, the metallic layer 24 may become increasingly more dewet and break into small and smaller metallic fingers. FIG. 3E shows that displacements due to the dewetting of the metallic layer 24 provide the film 14 on the substrate surface 12.

Figure 3F:
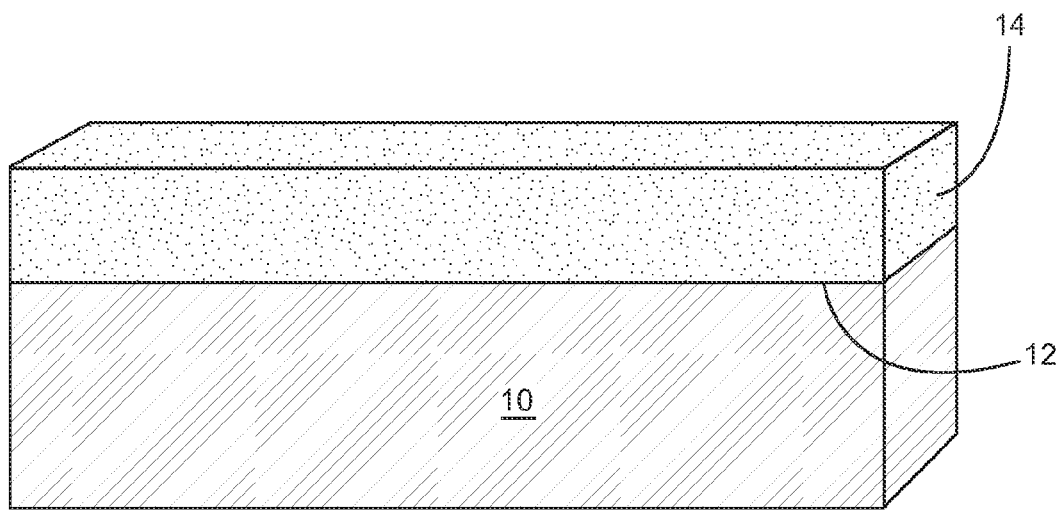

FIG. 3D also shows that the heating of the metallic layer 24 may cause the metallic layer 24 to be evaporated from the substrate surface 12. As time passes, additional amounts of the metallic material from the metallic layer 24 are evaporated from the substrate surface 12. In this case, the evaporation of the metallic layer 24 continues until the metallic layer 24 is removed from the substrate surface 12. FIG. 3F shows that removing the metallic layer can also provide the film 14 on the substrate surface 12. Since the removal of the metallic layer 24 is done through evaporation, the metallic layer 24 is not removed from the substrate surface 20 until after the metallic layer 24 becomes dewetted. The dewetting and evaporation rates of the metallic layer 24 may be dependent on heating and thermodynamic characteristics of the metallic layer 24 and substrate 10. Other parameters, such as designed changes in pressurization within the vacuum chamber may cause and/or contribute to the dewetting and evaporation rates.

While the embodiment of the CVD process described in FIGS. 3C-3F shows the evaporation of the metallic layer 24 continues until the metallic layer 24 is removed from the substrate surface 12, this is not necessarily the case. Other factors such as the time duration required to remove the metallic layer 24 may factor into whether the CVD process removes the metallic layer 24. Thus, in alternative embodiments, while the film 14 is provided on the substrate surface 12 by the dewetting of the metallic layer 24, portions of the metallic layer 24 such as metallic fingers, metallic puddles, and/or metallic droplets may remain after the end of the CVD process and cool on the substrate surface 12.

If the metallic layer 24 is formed to have a thickness of 450 nm, high quality graphene is produced on the metallic surface 26 about 2 hours after beginning the CVD process. However, it may take total time duration of 7 hours to remove the metallic layer 24 from the substrate surface 12. This additional time may cause defects to the film 14 in which large sections of the film 14 are formed as other carbon allotropes, such as graphite. Although the reasons for these defects are currently unclear, one possibility is that the film 14 breaks under stress as a result of displacements caused by the evaporation of the metallic layer 24. In turn, this exposes the underlying copper to further catalyst reaction, which results in an increasing number of defects in the graphene and/or in the formation of graphite in the film 14. Another possibility is that copper residue may form on top of the graphene after an extended period of time thereby causing sections of the film 14 to be formed as graphite.

On the other hand, while decreasing the thickness of the metallic layer 24 may shorten the time duration for removal of the metallic layer 24, the decreased thickness may cause other defects in the graphene, such as discontinuities. To obtain the largest continuous coverage area of the film 14 on the substrate surface 12, it is desirable for the dewetting to begin after the film 14 has been deposited on the metallic surface 26. Otherwise, the metallic layer 24 is displaced by the dewetting of the film 14 prior to the formation of the film 14 on the metallic surface 26 and portions of the substrate surface 12 may not be covered by the film 14.

Thus, while the film 14 is provided on the substrate surface 12 due to the progression of the dewetting of the metallic layer 24, thinner metallic layers 24 can create discontinuities in the film 14 and bare areas on the substrate surface 12. For example, if the metallic layer 24 is provided to have a thickness of 100 nanometers, the metallic layer 24, which in this case is made from copper, may evaporate after a smaller total time period of 5 hours. However, the metallic layer 24 begins to dewet after only 15 minutes and thus the film 14 is formed with discontinuities. Consequently, there may be a trade-off between the homogeneity of graphene in the film 14, the desired continuous coverage area of the film 14, and the amount of the metallic layer 24 that can remain on the substrate surface 12 after the CVD process. Different embodiments of the CVD process described in FIGS. 3C to 3F may select different time durations for the CVD process, thicknesses for the metallic layer 24, temperatures, flow rates for the precursor, and pressures depending on the desired quality and characteristics of the film 14 and the metallic material of the metallic layer 24.

Figure 4:
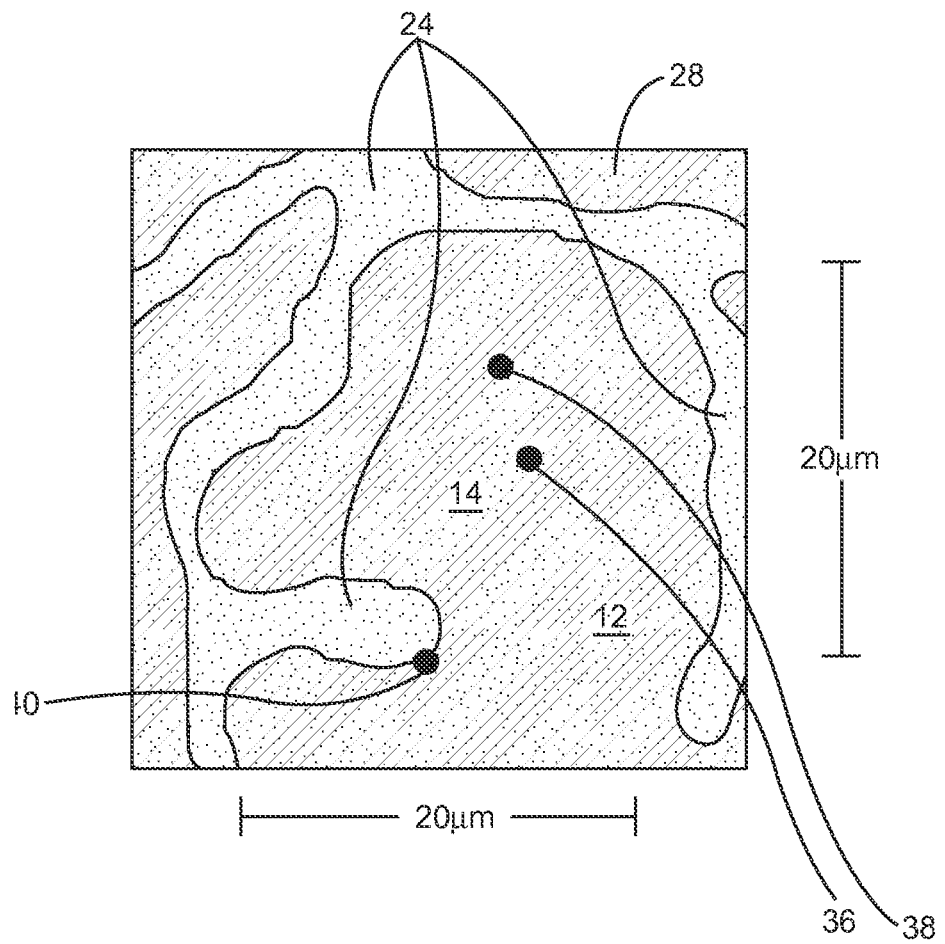
FIG. 4 is a top few of a section of the film after approximately 2 hours of a chemical vapor deposition (CVD) process described in FIGS. 3C-3F.
Figure 5:
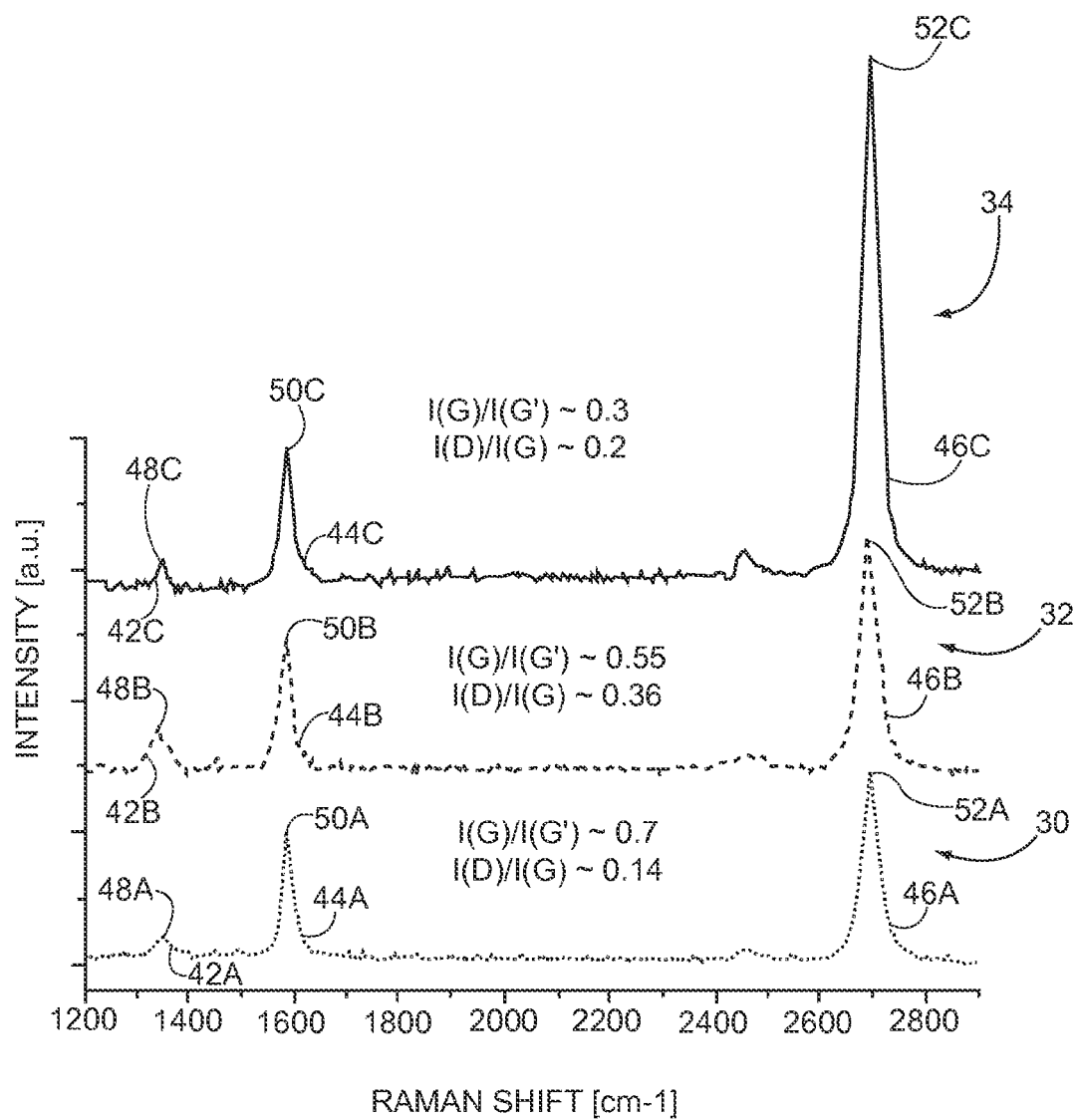
FIG. 5 is an illustration of Raman signatures at different locations of the film shown in FIG. 4.

Referring now to FIG. 4 and FIG. 5, FIG. 4 illustrates a top view of a section 28 of the film 14 after about 2 hours of the CVD process. In this example, the substrate 10 is made of quartz. The section 28 includes an area of approximately 20 µm2 of continuous film 14 on the substrate surface 12. The metallic layer 24 was originally provided on the substrate surface 12 with a thickness of around 450 nm (see FIG. 3B). As discussed above, this is not sufficient time to entirely evaporate and remove the metallic layer 24. However, after 2 hrs of the CVD process, the metallic layer 24 has dewetted and forms the metallic fingers shown in FIG. 4.

Raman spectroscopy may be used to detect and measure the quality of the film 14. Raman spectroscopy is selected due to its structural sensitivity and thus allows for different allotropes of a substance to be detected. FIG. 5 shows the Raman signatures 30, 32, 34 of the film 14 taken at the locations 36, 38, 40 (shown in FIG. 6), respectively. The Raman signatures 30, 32, 34 measure intensity in arbitrary units (a.u.) versus Raman shift in inverse centimeters (cm-1). These Raman signatures 30, 32, 34 were measured utilizing an Atomic Force Microscope (AFM) manufactured by WITec using a 532 nm laser, which is a powerful and well recognized method for the characterization of carbon-based materials. As shown in FIG. 5, each Raman signature 30, 32, 34, has a D-band, 42A, 42B, 42C, a G-band, 44A, 44B, 44C, and a G-prime-band (G'-band), 46A, 46B, 46C (also commonly referred to as the 2D band). Furthermore, each D-band, 42A, 42B, 42C, has a peak intensity 48A, 48B, 48C, each G-band 44A, 44B, 44C has a peak intensity 50A, 50B, 50C and each G' band 46A, 46B, 46C has a peak intensity of 52A, 52B, 52C.

Graphene and graphite may be distinguished in accordance to the characteristics of the G-band, 44A, 44B, 44C, and the G' band 46A, 46B, 46C. The peak intensity 50A, 50B, 50C of the G-band 44A, 44B, 44C, is associated with C-C sp2 stretch vibrations of the fused six-carbon rings in graphene and graphite, which ideally have a Raman shift at around 1580 cm-1, as opposed to the C-C sp3 bonds of amorphous carbons. The G' band 46A, 46B, 46C is the second order of zone-boundary phonons, and is the second most prominent peak seen in graphite and graphene. The G' band 46A, 46B, 46C can be seen at a Raman shift of around 2700 cm-1.

On the quartz substrate 10, if the material at the locations 36, 38, 40 were graphite, the G' band 46A, 46B, 46C could be deconstructed into two Lorenzians roughly ¼ and ½ the peak intensity 50A, 50B, 50C of the G-band 44A, 44B, 44C. However, this is not the case. Single-layer graphene may have a single and sharp G' band 46A, 46B, 46C roughly 4 times the peak intensity 50A, 50B, 50C of the G-band 44A, 44B, 44C. As the number of layers in the graphene increase, the relative peak intensity of 52A, 52B, 52C of the G' band 46A, 46B, 46C decreases as the G' band 46A, 46B, 46C becomes wider. While the peak intensity 48A, 48B, 48C of the G-band 44A, 44B, 44C in graphene and graphite are comparable, the peak intensity of 52A, 52B, 52C of the G' band 46A, 46B, 46C in graphene, unlike graphite, is higher than the peak intensity 50A, 50B, 50C of the G-band 44A, 44B, 44C. Consequently, a ratio I(G)/I(G') between the peak intensity 50A, 50B, 50C of the G-band 44A, 44B, 44C and the peak intensity of 52A, 52B, 52C of the G' band 46A, 46B, 46C can determine the type of material at the locations 36, 38, 40. For graphene, the ratio I(G)/I(G') should be less than one (1). On the other hand, at the locations 36, 38, 40 are approximately 0.7, 0.55, and 0.3 respectively. The Raman signature commonly seen for single- or few-layer graphene has a ratio I(G)/I(G') and between around 0.3-0.7 and thus the Raman signatures 30, 32, 34 indicate that 1-3 layer graphene was formed on the substrate surface 12 after 2 hours of the CVD process. Note that the discussion above regarding the ratios I(G)/I(G') and I(D)/I(G) for graphene are applicable when the material of the substrate 10 is quartz. Other materials for the substrate 10 may significantly alter or distort the Raman signatures 30, 32, 34 and thus may not exhibit the above discussed relationships.

Next, the D-band 42A, 42B, 42C, is associated with the degree of disorder in carbon based materials. The degree of sp3 bonding intensifies the D-band 42A, 42B, 42C and thus the D-band 42A, 42B, 42C is an indication of the quality of the graphene in the film 14. The ratio, I(D)/I(G) between the peak intensity 50A, 50B, 50C of the D-band 42A, 42B, 42C and peak intensity 48A, 48B, 48C of the G-band 44A, 44B, 44C is considered to be proportional to the amount of structural defects and inversely proportional to the domain size of the graphene. Note that ideal single-layer graphene would theoretically show little to no D-band 42A, 42B, 42C and the ratio, I(D)/I(G) would be zero. In this example, the ratio I(D)/I(G) at locations 36, 38, 40 are 0.14, 0.36, and 0.2, thereby indicating the presence of high-quality graphene.

Figure 6:
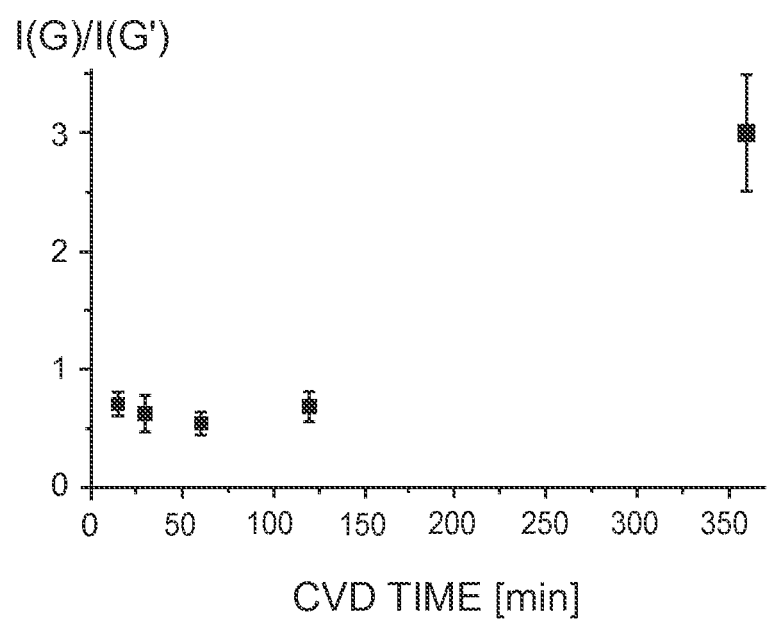
FIG. 6 is a graph of the average I(G)/I(G') ratio of the film as a function of the time duration of the CVD process described in FIGS. 3C-3F.
Figure 7:
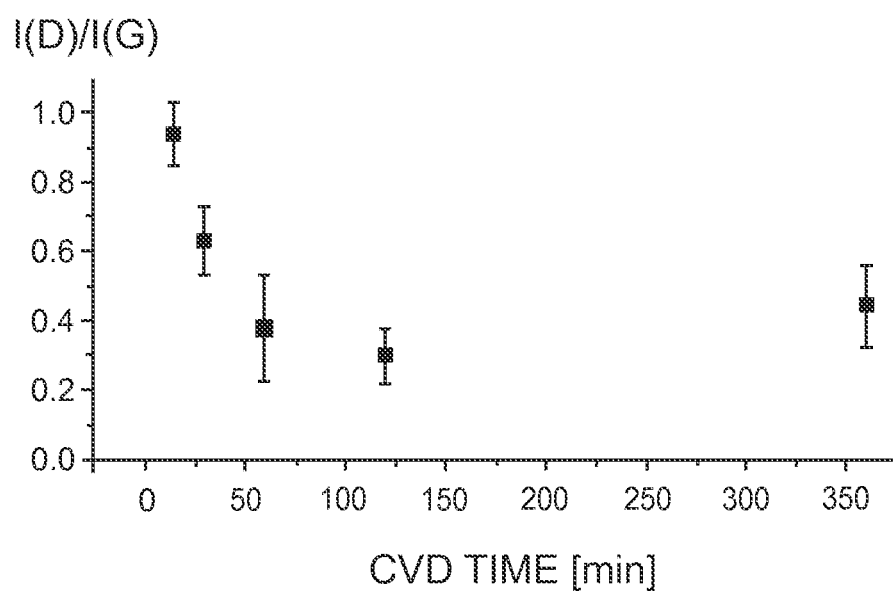
FIG. 7 is a graph of the average I(D)/I(G) ratio of the film as a function of the time duration of the CVD process described in FIGS. 3C-3F.

Referring now to FIG. 6 and FIG. 7, FIG. 6 shows the averaged ratio I(G)/I(G') and FIG. 7 shows the averaged ratio of I(D)/I(G) as a function of the time duration of the CVD process with the 450 nm metallic layer and the substrate 10 made of quartz. The averaged ratio I(G)/I(G') exhibits only minor change up to 2 hour growth and remains at ~0.68, and then climbs to ~3 for 6 hour growth. On the other hand, area-averaged I(D)/I(G) drops from ~0.9 to ~0.3 for 15 minute and 2 hour growths, respectively, followed by an increase to ~0.45 for further growth time (6 hours). The initial decrease of the I(D)/I(G) may be attributed to the increase in film continuity and the formation of larger domains with longer growth time. Interestingly, during the first 2 hours of growth, no significant change in the averaged ratio I(G)/I(G') is measured, suggesting that the number of layers and the stacking order in the deposited graphene may be independent of the time duration of the CVD process within a 2 hour range. After 6 hours of growth, the average ratio I(G)/I(G') of the film 14 is much greater than three. However, Raman spectroscopy confirms that the film 14 still has areas of graphene with a I(G)/I(G') ratio of around 0.45. However, areas of graphite have formed in the film 14 thereby significantly increasing the average ratio I(G)/I(G') over the film 14. The average I(D)/I(G) of the film after 6 hour growth confirms the decrease in the quality of the film 14. Accordingly, as discussed above there may be trade-offs between the homogeneity of the graphene in the film 14, the desired continuous coverage area of the film 14, and the amount of the metallic layer 24 that can remain on the substrate surface 12 after the CVD process. However, improvements to the CVD process may minimize or even eliminate these trade-offs given advancements in for example, CVD technology and the material sciences.

Figure 8:
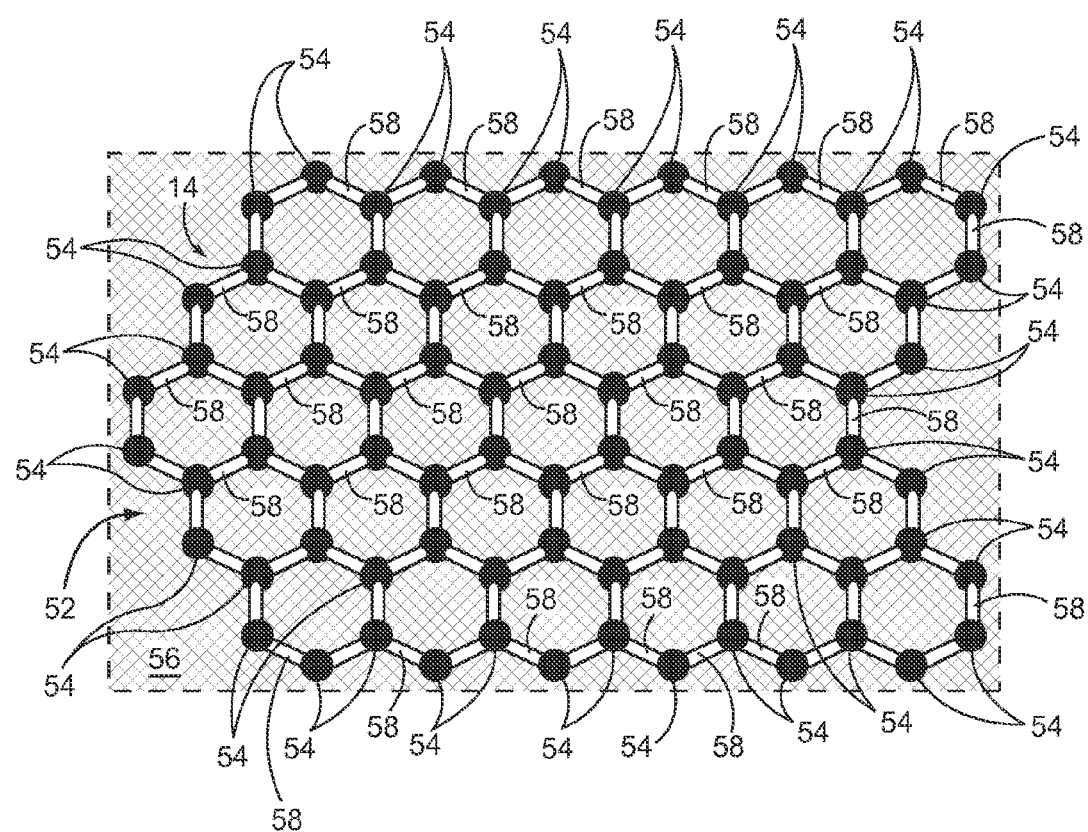
FIG. 8 is a molecular representation of one embodiment of ideal single-layer graphene.

Graphene is a 2-D allotrope of carbon. FIG. 8 is a molecular illustration of ideal single-layer graphene 52, which may be formed in accordance with the CVD process described above. Note that FIG. 8 and other molecular illustrations throughout this disclosure are simply molecular representations and are not intended to provide accurate molecular depictions of the molecular structures they represent. For example, molecular representations in this disclosure may be out of scale and may also be inherently inaccurate based on the principles of quantum mechanics, such as Heisenberg's uncertainty principle and principles of wave-particle duality, which teach us that the position and momentum of particles cannot be known with arbitrarily high precision. With that cautionary note to the reader, atoms in the molecular representations are represented by spheres and the atoms are connected to one another using tubes to represent bonds between the atoms.

As shown in FIG. 8, ideal single-layer graphene 52 is a 2-D material because the carbon atoms 54 are predominately bonded to one another along a plane 56. (All of the black spheres in FIG. 8 represent carbon atom, however, for the sake of clarity, not all of the black spheres have been labeled as "54"). Ideal single-layer graphene 52 is a monolayer of the carbon atoms 54 uniformly bonded to one another in six-member rings 58 through the sp2 electron orbital. The plane 56 of ideal single-layer graphene 52 is essentially a flat Euclidean plane and the six-member rings 58 and the bonds between the carbon atoms 54 are all formed on the plane 56.

Ideal single-layer graphene 52 exhibits many interesting properties. For example, the carriers (electrons and holes) in ideal single-layer graphene 52 behave as massless Dirac fermions with linear energy-momentum dispersion relation and pseudo-spin (chirality) at the Dirac points. Some interesting phenomena have been observed experimentally in ideal single-layer graphene 52 such as the anomalous quantum-Hall effect, finite conductivity (~4e2/h) in the limit of zero carrier concentration, and a transmission probability of unity (incidental angle dependent) through any potential barrier, including percolation among electron and hole puddles. Experimental measurements show that ideal single-layer graphene 52 can have a mobility of around 20,000 square-cm/Vs and a mean-free path of around 0.3 μm. In addition, the bandgap of ideal single-layer graphene 52 may be opened up so that it can be patterned into nanometer-scale nanoribbons.

Figure 9:
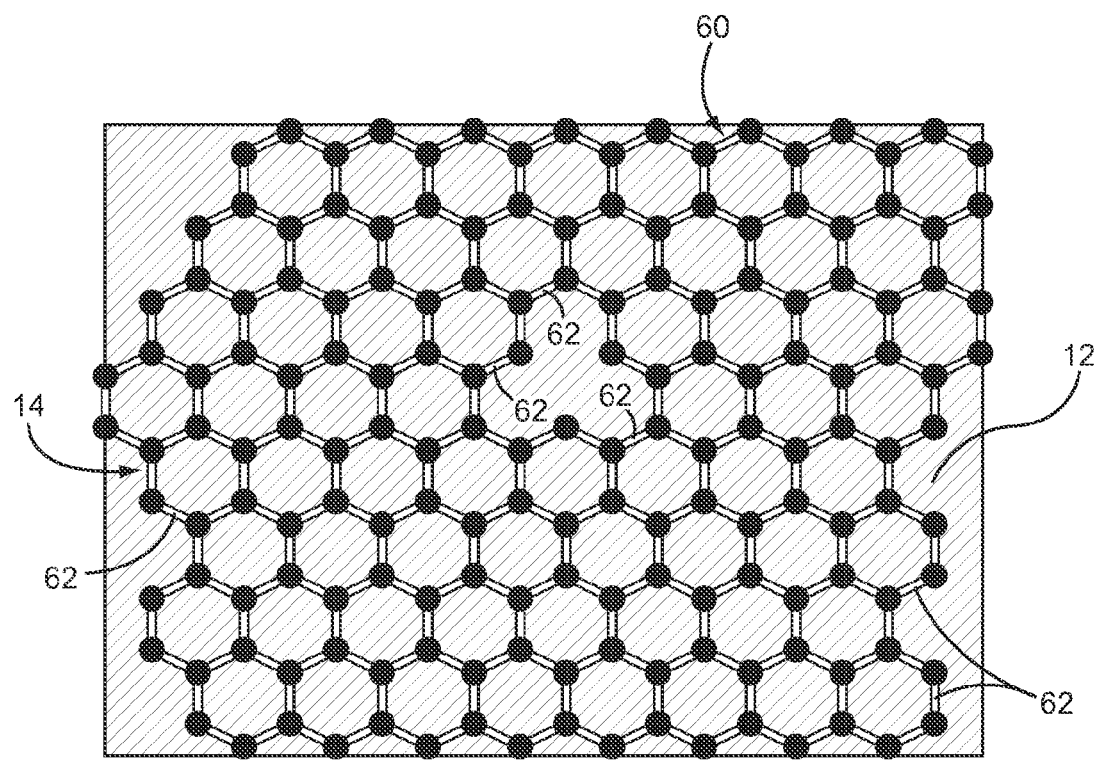
FIG. 9 is a molecular representation of another embodiment of non-ideal single-layer graphene.

However, while ideal single-layer graphene 52 for the film 14 is within the scope of this disclosure, non-ideal single-layer graphene as well as few-layer graphene may also be formed by the CVD process discussed above. For example, FIG. 9 is an illustration of one embodiment of non-ideal single-layer graphene 60, which may be formed by the CVD process discussed above. In FIG. 9, discontinuities have formed in some of the rings 62 of the film 14, and the rings 62 are not been completely closed. These discontinuities may be formed by non-ideal surface conditions during the formation of the film 14 on the substrate surface 12 (shown in FIG. 3A) or on the metallic surface 26 (shown in FIG. 3B). In addition, impurities on or in the film 14, such as the by-products formed during CVD process or doping materials provided in the film 14 and the heating of the film 14 may create discontinuities in the film 14. Discontinuities can also be caused by the dewetting and evaporation of the metallic layer 24. If the sizes of these discontinuities are large enough, the substrate surface 12 may be exposed through the film 14. Also, unconnected sections, such as islands, peninsulas, and other discontinuities of the non-ideal single-layer graphene 60 may be formed in the film 14 and thus the film 14 may not be perfectly continuous.

FIG. 10 illustrates another embodiment of non-ideal single-layer graphene 64 which may be formed by the CVD process discussed above. As shown in FIG. 10, while the non-ideal single-layer graphene 64 has six-member rings 58 as in the ideal single-layer graphene 52 shown in FIG. 8, the non-ideal single-layer graphene 64 of FIG. 10 is formed with non-ideal rings 66, which in this example are five-member rings 68 and eight-member rings 70. This non-ideal single-layer graphene 64 thus exhibits one type of 5-8-5 symmetry. Other embodiments of non-ideal single-layer graphene 64 may form other non-ideal rings 66 configurations and have other types of non-ideal symmetry. All of the possible non-ideal ring 66 combinations and symmetries are not shown here due to the plethora of possible combinations and symmetries. However, some other alternative configurations and symmetries that may be formed in the film 14 are, for example, seven-member rings attached to an eight-member ring 70, other types of 5-8-5 symmetries, five-member rings 68 attached to six-member rings 58, eight-member rings 70 surrounded by six-member rings 58, and the like.

FIG. 11 is a molecular representation of another embodiment of non-ideal single-layer graphene 72 having non-ideal rings 66. As shown in FIG. 11, the non-ideal single-layer graphene 72 is a 2-D material since the carbon atoms form rings that are predominately bonded along a plane 74. However, the non-ideal single-layer graphene 72 in FIG. 11 is not an ideal 2-D material because the plane 74 is not entirely a Euclidean plane but rather the non-ideal rings 66 cause the carbon atoms to be bonded on plane 74, which is at least partially non-Euclidean due to the curvature caused by the non-ideal rings 66. Consequently, not only is the CVD process applicable to form ideal 2-D materials like the ideal single-layer graphene 52 shown in FIG. 8, the disclosure is applicable to form the film 14 including or made entirely of non-ideal 2-D materials. Other characteristics that may cause curvatures in the plane 74 are the topographical characteristics of the substrate surface 12 (shown in FIG. 3A) and metallic surface 26 (shown in FIG. 3B).

Referring now to FIGS. 12 and 13, FIG. 12 is an illustration of ideal few-layer graphene 76, which in this case has four layers 78. The ideal few-layer graphene 76 is a 2-D material because the carbon atoms 54 (Note that all of the black spheres in FIG. 12 represent carbon atoms, however, for the sake of clarity not all of the black spheres have been labeled "54") of each layer 78 are predominantly (in this case, entirely) bonded on separate individual planes 80, which for ideal few-layer graphene 76 are Euclidean planes. Generally, few-layer graphene 76 may have any number of layers 78 but typically has 10 or fewer layers of graphene. By being bonded predominately along separate planes 80, each layer 78 is uncorrelated with the other layers 78 and the few-layer graphene 76 maintains essentially the quantum behavior and electrical characteristics of graphene.

On the other hand, FIG. 13 is an illustration of non-ideal few layer graphene 81, which in this case in non-ideal bi-layer graphene. Unlike the ideal few-layer graphene 76 shown in FIG. 12, sections 82 of one of the layers 78 has some of the carbon atoms 54 bonded to the some of the carbon atoms 54 on the other plane 80 of the film 14. (Note that all of the black spheres in FIG. 12 represent carbon atoms, however, for the sake of clarity not all of the black spheres have been labeled "54"). Thus, these sections 82 include three-dimensional (3-D) bonding between the layers 78 of carbon atoms 54. In FIG. 13, the non-ideal few-layer graphene 81 is a 2-D material because the planar connections and sp2 bonded carbon atoms 54 predominate and the non-ideal few-layer graphene 81 maintains essentially the quantum behavior and electrical characteristics of graphene. The extent of sp3 bonded carbon atoms 54 that form different types of carbon allotropes however may predominate in other sections (not shown) and thus would not form graphene. Thus, while the film 14 is made of a 2-D material having several layers, the 2-D material may be a non-ideal 2-D material as shown in FIG. 13. Furthermore, the film 14 of graphene may only be partially made of 2-D material and may have extensive sections formed of 3-D material, such as bulk graphite and other carbon allotropes. The best direct deposition of graphene results may be obtained on quartz and M-plane sapphire. However, it was also shown possible on silicon dioxide (SiO2) formed on a silicon wafer that is 300 nm in thickness and on fused silica.

Referring now to FIG. 14 and FIG. 15, FIG. 14 shows a top view of a section 84 of the film 14 formed on the substrate surface 12 prior to the removal but after the dewetting of the metallic layer 24. Consequently, the metallic layer 24 has formed metallic fingers 86. In this example, the film 14 is provided on the substrate surface 12 and forms wrinkles 88. The wrinkles 88 in the film 14 are quasi-periodic and, in this embodiment, have a typical separation of ~40-120 nm, a height of 1 nm-5 nm on the metallic fingers 86 and a height of ~0.8-1.2 nm on metal-free areas. As shown, the shape of these wrinkles 88 illustrate that the contour of the film 14 is bent based on the influence of the dewet metallic layer 24. In this embodiment, experimental measurements of the Raman signature near the edge of the metallic finger 86 give an average full-width half-maximum (FWHM) of the G' band of 30±5 cm-1, and an I(G)/I(G') ratio of ~0.3±0.06 cm-1, and an I(D)/I(G) ratio of 0.2±0.08 cm-1, thereby indicating that the film 14 is made of single-layer graphene. The Raman spectra from the metal-free areas give an average G'-band with an FWHM of 45±5 cm-1, a I(G)/I(G') ratio ~0.68±0.1, and an I(D)/I(G) ratio of ~0.3±0.06, which are typically shown by 1-3 layer graphene.

FIG. 15 is a close-up illustration of the film 14 formed near and over the metallic fingers 86. The presence of wrinkles 88 is non-ideal and the wrinkles 88 may form discontinuities 90 in the film 14. Although the film 14 is provided on the substrate surface 12, the wrinkles 88 in the film 14 are detached from the substrate surface 12. Also, the discontinuities 90 formed by the wrinkles 88 may create mid-gap states that deteriorate the conductance of the film 14 and may cause scattering. One possible mechanism for the formation of the wrinkles 88 is the stress-induced on the film 14 as the metallic layer 24 dewets and evaporates. The surface reconstruction (e.g. facet formation at high temperature) of metallic layer 24 or the substrate 10 could be another possible reason. In addition, the film 14 has a detached portion 92 near the edge of the metallic finger 86 that is suspended over the substrate surface 12. Interestingly, the Raman signatures near the metal fingers 86 exhibit intensity values about 1.5 times higher than the Raman signatures in the middle of the film 14, which may be due to the detached portion 92 being suspended over the substrate surface 12. It has been theoretically shown that the effective sampling by the laser spot of ~300 nm in diameter on the detached portion 92 is roughly ~1.4 times higher based on simple geometrical calculations alone.

While the wrinkles 88 and the modulations in the contour of the film 14 may form non-ideal graphene and may lower the quality of the graphene in the film 14, the formation of the wrinkles 88 due to the metallic fingers 86 may also be utilized to produce positive results. Theoretical models and experimental work show that a controllable introduction of the wrinkles 88 in the film 14 could potentially modulate the electronic properties of the film 14. Density functional theory predicts the possibility of increased hydrogenation in the wrinkles 88 as compared to a flat unwrinkled structure. This increase in hydrogenation may be due to the wrinkles 88 having locally enhanced chemical reactivity. Moreover, theoretical studies show that periodic potentials (by means of periodic electric or magnetic fields, patterning of impurities/charges and defects or deformations such as wrinkles 88) applied to the film 14 may create superlattice-like graphene structures, without the need of cutting and etching.

Note that the structures described in FIGS. 8-15 are not intended to be an exhaustive discussion of the possible characteristics of ideal and non-ideal graphene, as shall be recognized by one of ordinary skill in the art. For example, non-ideal graphene may have other non-ideal structures such as point defects, sub-domain boundaries, folded edges, and the like. While the non-ideal structures in non-ideal graphene may affect the quantum and electrical characteristics of the non-ideal graphene, such as the conductivity of the non-ideal graphene and/or the linear energy-momentum dispersion relation, non-ideal graphene behaves essentially although not necessarily perfectly in accordance with the known electrical and quantum characteristics of graphene. Note that graphene was discovered relatively recently when this disclosure was written and the possible behavioral characteristics and possible structural variations of graphene have not been fully explored. However, this disclosure is not limited to any particular embodiment of graphene or 2-D material and different embodiments, variations, and improvements to the deposition processes described herein may be used to form different types and configurations of graphene as well as films 14 of other types of ideal and non-ideal 2-D materials.

Those skilled in the art will recognize improvements and modifications to the preferred embodiments of the present disclosure. All such improvements and modifications are considered within the scope of the concepts disclosed herein and the claims that follow.

What is claimed is:

1. A method of providing a two-dimensional (2-D) material on a substrate, comprising:
   providing the substrate having a substrate surface and a metallic layer formed on the substrate surface, wherein the metallic layer has a metallic surface;
   depositing a film on the metallic surface, wherein the film comprises the 2-D material; and
   dewetting the metallic layer so that the film is provided on the substrate surface.

2. The method of claim 1, further comprising removing the metallic layer.

3. The method of claim 2, wherein removing the metallic layer comprises evaporating the metallic layer.

4. The method of claim 1, wherein the substrate further comprises a wafer formed from a dielectric material and the substrate surface is a surface of the wafer.

5. The method of claim 4, wherein the wafer is made from a dielectric material selected from a group consisting of quartz, sapphire, and fused silica.

6. The method of claim 1, wherein the substrate comprises an insulating layer formed from a dielectric material, wherein the substrate surface comprises a surface of the insulating layer.

7. The method of claim 6, wherein the insulating layer is formed on a wafer made from a semiconductor material.

8. The method of claim 6, wherein the insulating layer comprises a type of silicon oxide.

9. The method of claim 1, wherein providing the substrate having the substrate surface and the metallic layer formed on the substrate surface further comprises forming the metallic layer on the substrate surface.

10. The method of claim 9, wherein forming the metallic layer on the substrate surface further comprises forming the metallic layer on the substrate surface by an electron-beam physical vapor deposition process.

11. The method of claim 1, further comprising heating the substrate.

12. The method of claim 11, wherein depositing the film on the metallic surface comprises applying a precursor to the metallic surface so that the precursor experiences catalytic decomposition on the metallic surface to form the film comprising the 2-D material during the heating of the substrate.

13. The method of claim 12, wherein dewetting the metallic layer so that the film is formed on the substrate surface is caused by the heating of the substrate.

14. The method of claim 13, wherein dewetting the metallic layer so that the film is formed on the substrate surface occurs after depositing the film on the metallic surface.

15. The method of claim 11, wherein the metallic layer comprises copper.

16. The method of claim 15, wherein heating the substrate comprises heating the substrate to between about 900° C. to 1000° C.

17. The method of claim 1, wherein the 2-D material is selected from a group comprising graphene and boron-nitride.

18. The method of claim 17, wherein the graphene is either single-layer graphene or few-layer graphene.

19. A method of creating graphene, comprising:
providing a substrate having a substrate surface and a metallic layer formed on the substrate surface, wherein the metallic layer has a metallic surface;
depositing a carbon-based film on the metallic surface, wherein the carbon-based film comprises the graphene; and
dewetting the metallic layer so that the carbon-based film is provided on the substrate surface.

20. The method of claim 19, further comprising removing the metallic layer.

21. The method of claim 20, wherein removing the metallic layer comprises evaporating the metallic layer.

22. The method of claim 19, wherein the carbon-based film has a location with a Raman signature that measures intensity in arbitrary units versus Raman shift in $cm^{-1}$ and the Raman signature has a G-band and G'-band with a ratio between a peak intensity of a G-band and a peak intensity of the G'-band that is less than one (1) after the carbon-based film is provided on the substrate surface.

23. The method of claim 19, wherein providing the substrate having the substrate surface and the metallic layer formed on the substrate surface includes providing the metallic layer with a thickness between about 20 nanometers to 1 micrometer.

24. The method of claim 23, wherein providing the substrate having the substrate surface and the metallic layer formed on the substrate surface includes providing the metallic layer so that the thickness is between about 100 nanometers to 450 nanometers.

25. The method of claim 24, wherein the metallic layer comprises copper.

26. The method of claim 19, further comprising heating the substrate.

27. The method of claim 26, wherein depositing the carbon-based film on the metallic surface comprises applying a precursor during the heating of the substrate, the precursor comprising a hydrocarbon that experiences catalytic decomposition on the metallic surface to form the graphene.

28. The method of claim 19, wherein the graphene is either single-layer graphene or few-layer graphene.

* * * * *